(12) United States Patent
Ni et al.

(10) Patent No.: US 8,133,796 B1
(45) Date of Patent: Mar. 13, 2012

(54) METHOD FOR FABRICATING SHALLOW TRENCH ISOLATION STRUCTURES

(75) Inventors: Chih-Jung Ni, Taichung (TW); Chia-Hung Lu, Taichung (TW)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 13/041,431

(22) Filed: Mar. 6, 2011

(51) Int. Cl.
*H01L 21/76* (2006.01)
(52) U.S. Cl. .................. 438/424; 438/296; 257/E21.546
(58) Field of Classification Search .................. 438/135, 438/359; 257/E21.532, E21.533, E21.534, 257/E21.536, E21.541, E21.542, E21.543
See application file for complete search history.

(56) References Cited

U.S. PATENT DOCUMENTS

| 6,995,095 | B2 * | 2/2006 | Yu ................................. 438/750 |
| 7,196,381 | B2 | 3/2007 | Hsiao et al. |

* cited by examiner

*Primary Examiner* — Cheung Lee
(74) *Attorney, Agent, or Firm* — Jianq Chyun IP Office (57) ABSTRACT

A method for fabricating shallow trench isolation structures is provided. A patterned pad layer and a patterned mask layer are sequentially formed on a substrate, wherein the substrate includes a memory region and a periphery region. By using the patterned mask layer as a mask, the substrate is partially removed to form a plurality of trenches. A first liner layer is formed on the substrate to cover surfaces of the patterned mask layer, the patterned pad layer and the trenches. After removing the first liner layer in the periphery region, a pull-back process is performed on the patterned mask layer, and a pull-back amount of the patterned mask layer in the periphery region is larger than a pull-back amount of the patterned mask layer in the memory region. An insulating layer is formed in the trenches to form a plurality of shallow trench isolation structures.

11 Claims, 9 Drawing Sheets

METHOD FOR FABRICATING SHALLOW TRENCH ISOLATION STRUCTURES

BACKGROUND OF THE INVENTION

1. Field of the Invention

The present invention is related to a method for manufacturing isolation structures and more particularly to a method for manufacturing shallow trench isolation (STI) structures.

2. Description of Related Art

As semiconductor technology advances, dimensions of the semiconductor devices have also continued miniaturizing. Accordingly, the isolation between devices becomes more important as the isolation can effectively prevent the neighboring devices from shortage. In recent years, the most popular method used in the industry is a shallow trench isolation (STI) structure process.

Generally, a shallow trench isolation (STI) structure process includes the following. A pad oxide layer and a patterned mask layer are formed sequentially on the substrate, and then by using the patterned mask layer as a mask, a portion of the substrate is removed to form a shallow trench. Next, a STI structure is formed by filling insulation material in the shallow trench. Thereafter, the pad oxide layer and the patterned mask layer are removed by etching. In the method mentioned above, the step of removing the pad oxide layer may also remove a portion of the STI structure. Particularly, an upper corner of the STI structure tends to be removed, so that a divot around the upper corner is generated. Thus, a tunnel oxide layer or a gate oxide layer subsequently formed on the upper corner of the STI structure is too thin, which has a side effect on the flash memory device.

In order to prevent the phenomenon of the corner thinning resulted from the formation of the tunnel oxide layer or the gate oxide layer mentioned above, one of the conventional solutions is to pull back the patterned mask layer. In detail, after the STI structure is formed, the patterned mask layer is pulled back, thereafter a thermal oxidation process is performed on the STI structure to repair damage and reduce stress. In other words, a portion of the patterned mask layer is etched, and therefore the patterned mask layer is pulled back relative to the periphery of the STI structure. Then, a space, formed as the patterned mask layer pulled back, is filled with insulation material used to form the STI structure. The insulation material filling the space serves as a buffer layer, and thus the damage to the upper corner of the STI structure, resulted from an etching process to the pad oxide layer, is reduced. Accordingly, the divot around the upper corner of the STI structure is prevented. Therefore, when the tunnel oxide layer or the gate oxide layer is formed on the STI structure, the tunnel oxide layer or the gate oxide layer may has an uniform thickness on the upper corner and bulk of the STI, and the phenomenon of the corner thinning is not observed.

In addition, with the continual miniaturization of the dimensions of the memory devices, a pull-back amount of the patterned mask layer in the memory region is also gradually reduced. However, before the gate oxide layer is formed, the etching amount of the periphery region in the memory device is usually larger than that of the memory region in the memory device during the wet etching process. Furthermore, the periphery region in the memory device is driven by a higher driving voltage. Therefore, the thickness of the high-voltage gate oxide layer is difficult to reduce, and the patterned mask layer in the periphery region faces the issues of an insufficient pull-back amount. In other words, the divot may be generated around the upper corner of the STI structure due to the exposure. Thus, the gate oxide layer formed on the STI structure has an issue of the corner thinning and growth in the divot. Hence, the characteristics and the reliability of the memory device are deteriorated greatly.

SUMMARY OF THE INVENTION

The present invention is directed to a method for fabricating shallow trench isolation structures, which improves the characteristics of the memory device.

The present invention provides a method for fabricating shallow trench isolation structures. A patterned pad layer and a patterned mask layer are sequentially formed on a substrate, wherein the substrate includes a memory region and a periphery region. A portion of the substrate is removed by using the patterned mask layer as a mask to form a plurality of trenches. A first liner layer is formed on the substrate to cover surfaces of the patterned mask layer, the patterned pad layer and the trenches. The first liner layer covering the surfaces of the patterned mask layer, the patterned pad layer and the trenches in the periphery region are removed. A pull-back process is performed on the patterned mask layer, wherein a pull-back amount of the patterned mask layer in the periphery region is larger than a pull-back amount of the patterned mask layer in the memory region. An insulating layer is formed in the trenches to form a plurality of shallow trench isolation structures.

In an embodiment of the present invention, the first liner layer includes an oxide layer.

In an embodiment of the present invention, a material of the first liner layer includes high temperature oxide (HTO) or oxide formed by using tetra-ethyl-ortho-silicate (TEOS) as a source of the reactive gas.

In an embodiment of the present invention, the method further includes performing a densification process on the first liner layer in a nitrogen ambient and at a high temperature.

In an embodiment of the present invention, the step of removing the first liner layer covering the surfaces of the patterned mask layer, the patterned pad layer and the trenches in the periphery region includes forming a photoresist layer in the memory region to cover the first liner layer in the memory region; and removing the first liner layer in the periphery region.

In an embodiment of the present invention, a method of removing the first liner layer includes a wet etching process.

In an embodiment of the present invention, the pull-back process includes a wet etching process.

In an embodiment of the present invention, before forming the first liner layer, the method further includes forming a second liner layer to cover surfaces of the patterned mask layer, the patterned pad layer and the trenches.

In an embodiment of the present invention, a material of the second liner layer comprises silicon nitrides.

In an embodiment of the present invention, the method further includes performing a densification process on the first liner layer in a nitrogen ambient and at a high temperature.

In an embodiment of the present invention, in the pull-back process, the patterned mask layer in the memory region is covered sequentially by the second and first liner layers, and the patterned mask layer in the periphery region is covered by the second liner layer.

In view of the above, by using the method for fabricating shallow trench isolation structures of the present invention, the patterned mask layer has an appropriate pull-back amount in the periphery region and the memory region respectively.

Therefore, a divot is not generated around the upper corner of the shallow trench isolation structure, and the tunnel oxide layer or the gate oxide layer subsequently formed on the shallow trench isolation structure may have an uniform thickness on the upper corner and bulk of the STI structure. Accordingly, the phenomenon of the corner thinning is not observed. Hence, the characteristics and the reliability of the memory device are improved.

In order to make the aforementioned and other features and advantages of the invention more comprehensible, embodiments accompanying figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Generally, the periphery region is configured for forming high voltage devices and low voltage devices. Before the gate oxide layer is formed, the etching amount of the periphery region is usually larger than that of the memory region during the wet etching process. In addition, the thickness of the high-voltage gate oxide layer in the periphery region is difficult to reduce, and therefore an issue of the corner thinning of the high-voltage gate oxide layer is more serious in the periphery region. Furthermore, the low-voltage gate oxide layer may be even grown in the divot. Hence, the characteristics and the reliability of the memory device are deteriorated. The present invention is used for forming the STI structures according to the characteristics of the periphery region and the memory region in the memory device, and the issue of the corner thinning of the tunnel oxide layer or the gate oxide layer subsequently formed on the STI structure is prevented.

Figure 1A:
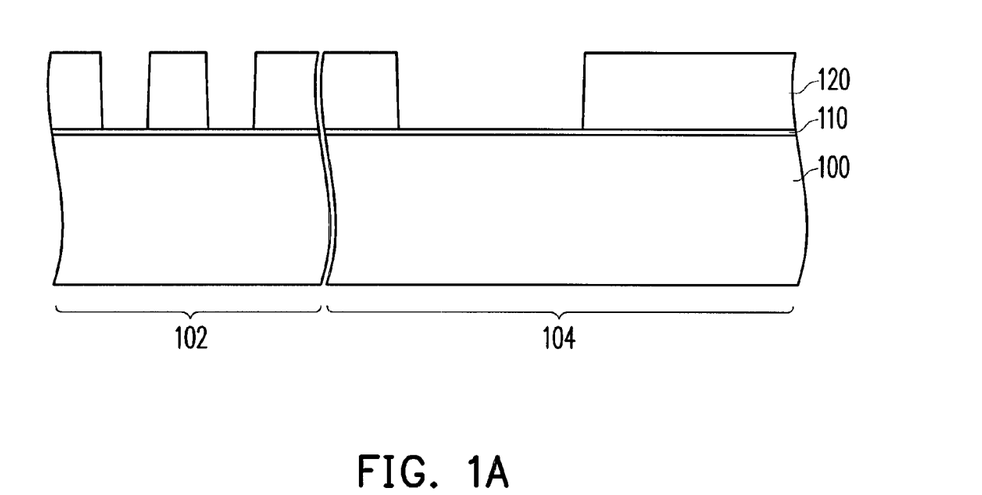
FIGS. 1A to 1F are schematic cross-sectional views illustrating a method for fabricating shallow trench isolation structures according to a first embodiment of the present invention.

FIGS. 1A to 1F are schematic cross-sectional views illustrating a method for fabricating shallow trench isolation structures according to a first embodiment of the present invention. Referring to FIG. 1A, first, a patterned pad layer 110 and a patterned mask layer 120 are sequentially formed on a substrate 100, wherein the substrate 100 includes a memory region 102 and a periphery region 104. The substrate 100 is, for example, a P-type doped silicon substrate, an N-type doped silicon substrate, an epitaxial silicon substrate, a gallium arsenide (GaAs) substrate, an indium phosphide (InP) substrate or a germanium silicide (SiGe) substrate. A material of the patterned pad layer 110 can be silicon oxide, and a method of forming the patterned pad layer 110 can be a thermal oxidation process or a chemical vapor deposition (CVD) process. A material of the mask layer 120 can be silicon nitride, and a method of forming the mask layer 120 can be CVD process.

Figure 1B:
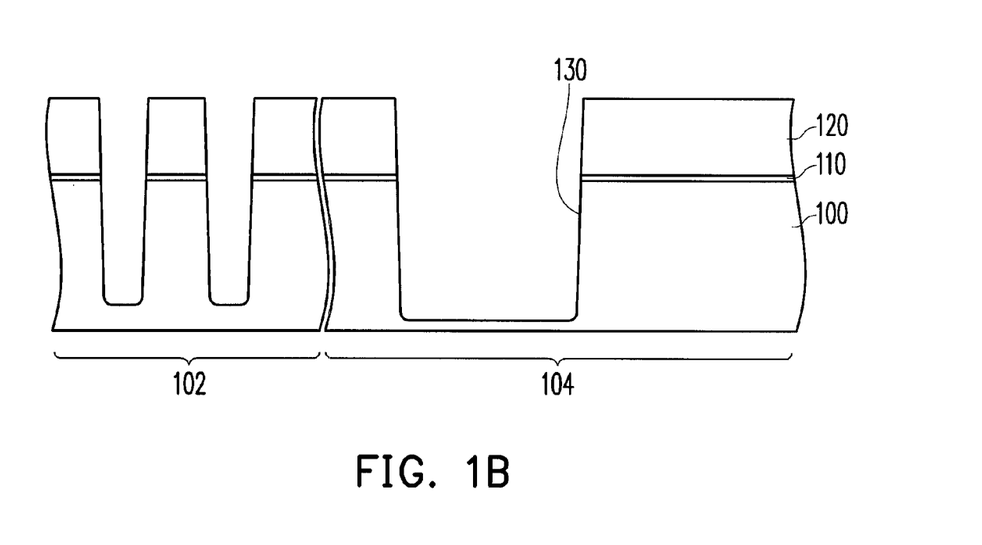

Referring to FIG. 1B, then, by using the patterned mask layer 120 as a mask, a portion of the substrate 100 is removed to form a plurality of trenches 130. In the present embodiment, a method of removing the portion of the substrate 100 is a reactive ion etching method, for example. After the trenches 130 are formed, a rapid thermal oxidation (RTO) process can be performed on the substrate 100 and the patterned mask layer 120.

Figure 1C:
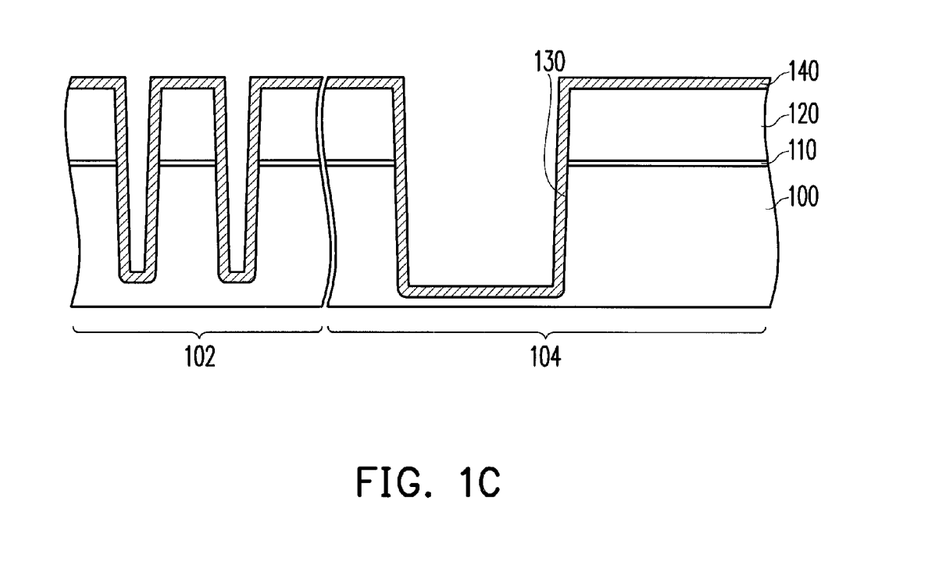

Referring to FIG. 1C, next, a first liner layer 140 is formed on the substrate 100 to cover surfaces of the patterned mask layer 120, the patterned pad layer 110 and the trenches 130. In other words, the first liner layer 140 covers the surfaces of the patterned mask layer 120, the patterned pad layer 110 and the trenches 130 in the memory region 102 and periphery region 104. In the present embodiment, the first liner layer 140 is an oxide layer, and the oxide layer includes high temperature oxide (HTO) or oxide formed by using tetra-ethyl-orthosilicate (TEOS) as a source of the reactive gas, for example. The thickness of the first liner layer 140 can be about 150 Å. The first liner layer 140 is formed through performing a low pressure chemical vapor deposition (LPCVD) process, for example.

In the present embodiment, after the first liner layer 140 is formed, a densification process is performed on the first liner layer 140. In an embodiment of the present invention, the densification process is performed in a nitrogen ambient and at a high temperature, wherein the high temperature is about 900° C. Particularly, in an embodiment of the present invention, a material of the first liner layer 140 includes silicon oxide, and thus by performing the densification process, an etching rate of the first liner layer 140 in an etching solution including hydrofluoric acid and ethylene glycol or hydrofluoric acid and glycerol substantially equals to an etching rate of the silicon nitride as much as possible.

Figure 1D:
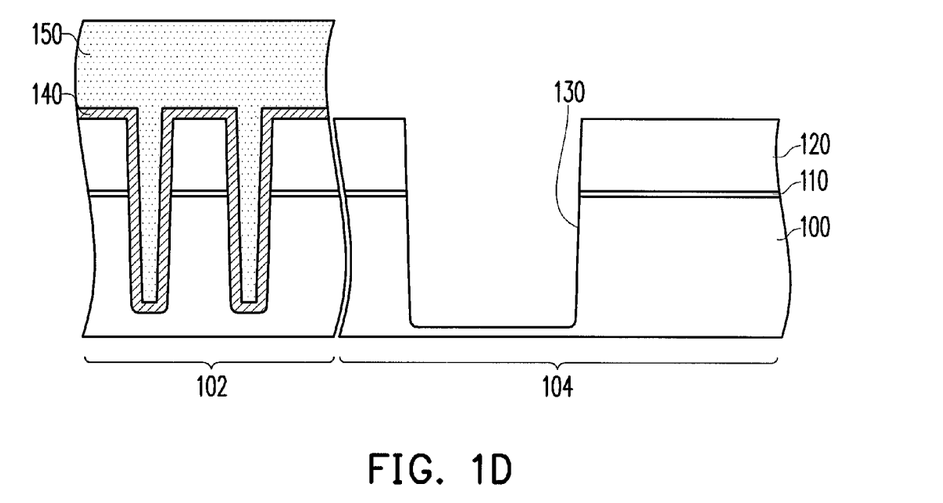

Referring to FIG. 1D, thereafter, the first liner layer 140 covering the surfaces of the patterned mask layer 120, the patterned pad layer 110 and the trenches 130 in the periphery region 104 is removed. In detail, in the present embodiment, a photoresist layer 150 is formed in the memory region 102 to cover the first liner layer 140 in the memory region 102, and then the first liner layer 140 in the periphery region 104 is removed. Accordingly, the first liner layer 140 in the memory region 102, covered by the photoresist layer 150, is retained. On contrary, the first liner layer 140 in the periphery region 104, not covered by the photoresist layer 150, is removed. A method of removing the first liner layer 140 can be a wet etching process by using buffer hydrofluoric acid (BHF) as the etching solution, for example.

Figure 1E:
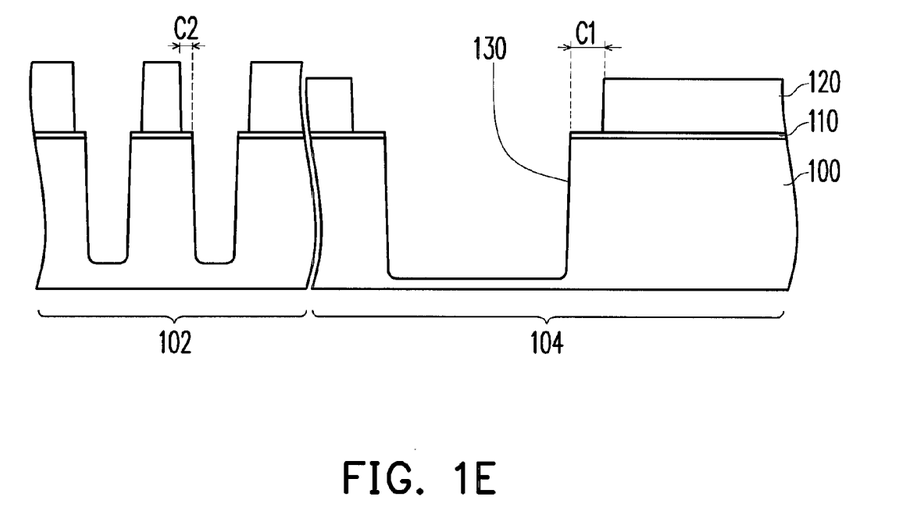

Referring to FIG. 1E, afterwards, the photoresist layer 150 is removed and a cleaning process is performed to remove residues. Next, a pull-back process is performed on the patterned mask layer 120, wherein a pull-back amount C1 of the patterned mask layer 120 in the periphery region 104 is larger than a pull-back amount C2 of the patterned mask layer 120 in the memory region 102. In an embodiment, the pull-back process can include a wet etching process by using the etching solution including hydrofluoric acid and ethylene glycol or hydrofluoric acid and glycerol. In the present embodiment, compared with the patterned mask layer 120 in the periphery region 104, the patterned mask layer 120 in the memory region 102 is protected by the first liner layer 140 covering thereon. Therefore, the pull-back amount C2 of the patterned mask layer 120 in the memory region 102 is less than the pull-back amount C1 of the patterned mask layer 120 in the periphery region 104. Particularly, the pull-back amount C1, C2 can be adjusted properly by controlling the thickness of the liner layer and the parameters for the pull-back process, such as etching time and so on. Furthermore, the thickness of the patterned mask layer 120 in the periphery region 104 is smaller than the thickness of the patterned mask layer 120 in the memory region 102.

Figure 1F:
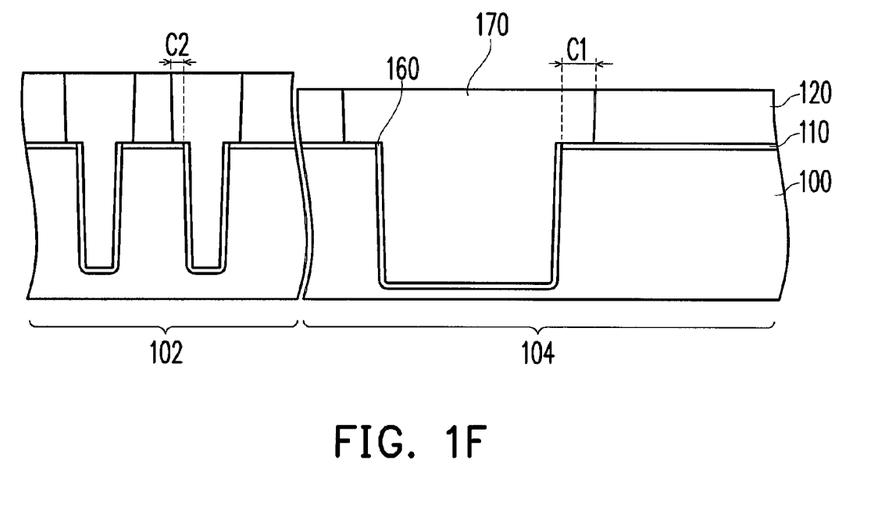

Referring to FIG. 1F, then, an insulating layer is formed in the trenches 130 to form a plurality of shallow trench isolation structures 170. In detail, in the present embodiment, an oxidation process is performed on the substrate 100 to form an oxide layer 160 on the surfaces of the trenches 130, and then the insulating layer is formed in the trenches 130 to form the shallow trench isolation structures 170. A material of the insulating layer can be silicon oxide, and a method of forming the insulating layer can be a plasma enhanced CVD (PECVD) process, an atmospheric pressure CVD (APCVD) process or a high-density plasma CVD (HDP-CVD) process. In an embodiment, the insulating layer can be planarized by performing a chemical-mechanical polishing (CMP) process.

After the shallow trench isolation structures 170 are formed, the subsequent fabrication processes to accomplish the memory device, such as removal of the patterned mask layer 120 and the patterned pad layer 110, formation of the tunnel oxide layer and the floating gate in the memory region 102, and formation of the gate oxide layer and control gate in the periphery region 104, can be known by the person having ordinary skill in the art, and then not further described here. Generally, the periphery region 104 is configured for forming the high voltage devices and low voltage devices. Before the gate oxide layer is formed, the etching amount of the periphery region 104 is usually larger than that of the memory region 102 during the wet etching process. In addition, the thickness of the high-voltage gate oxide layer in the periphery region 104 is difficult to reduce, and therefore an issue of the corner thinning of the high-voltage gate oxide layer is more serious in the periphery region 104.

Figure 4A:
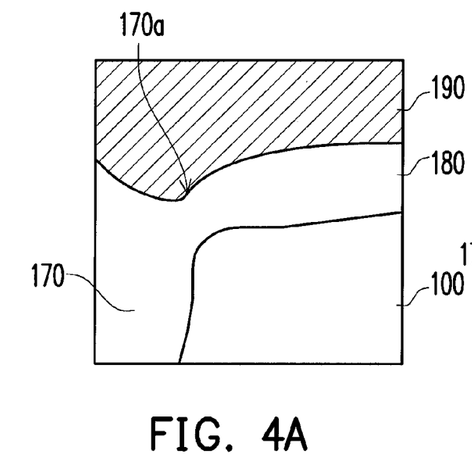
FIGS. 4A and 4B are schematic views respectively illustrating a portion of a high voltage region and a portion of a low voltage region according to prior art.
Figure 4B:
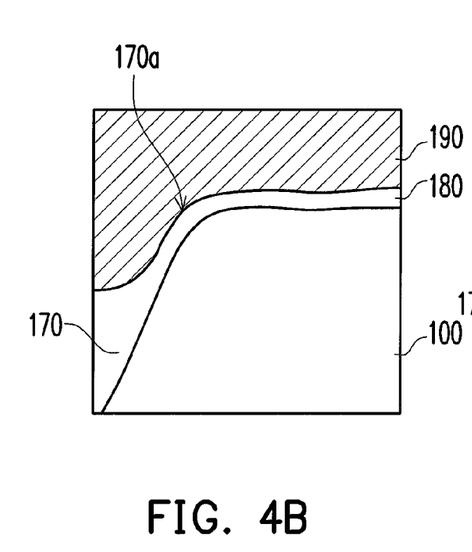
Figure 4C:
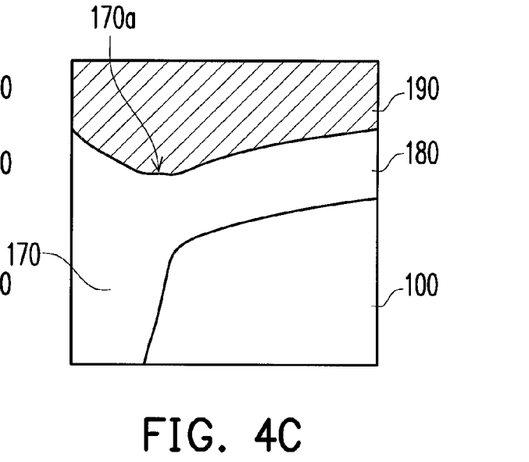
FIGS. 4C and 4D are schematic views respectively illustrating a portion of a high voltage region and a portion of a low voltage region according to an embodiment of the present invention.
Figure 4D:
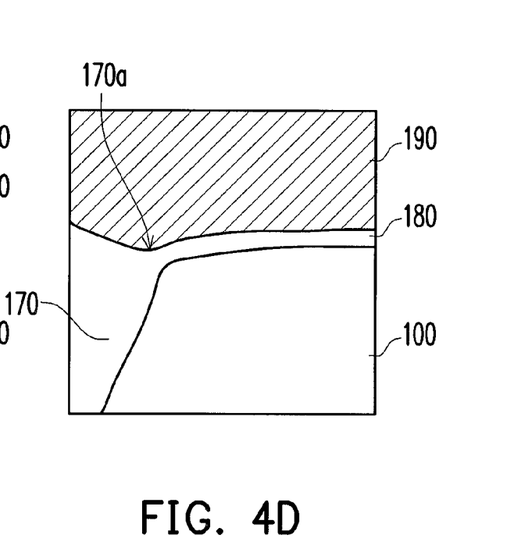

By contrast, in the present embodiment, by forming the first liner layer 140 in the pull-back process, the pull-back amount C1 of the patterned mask layer 120 in the periphery region 104 is larger than the pull-back amount C2 of the patterned mask layer 120 in the memory region 102. Accordingly, a space, formed as the patterned mask layer pulled back, is filled with the insulating material, and thus the upper corner of the STI structure 170 is prevented from being damaged by the etching solution used for removing the patterned pad layer 110. Accordingly, the phenomenon of the corner thinning is not observed in the tunnel oxide layer or the gate oxide layer subsequently formed on the STI structure 170, or is not formed in the divot. FIGS. 4A and 4B are schematic views respectively illustrating a portion of a high voltage region and a portion of a low voltage region according to prior art, and FIGS. 4C and 4D are schematic views respectively illustrating a portion of a high voltage region and a portion of a low voltage region according to an embodiment of the present invention, wherein a gate oxide layer 180 and a control gate 190 are formed on the substrate 100. As compared with the STI structure 170 formed by the conventional method and shown in FIGS. 4A and 4B, a divot is not observed around the upper corner 170a of the STI structure 170 formed by the method according to the present embodiment in FIGS. 4C and 4D. Therefore, the gate oxide layer 180 formed on the upper corner of the STI structure 170 may have an uniform thickness, and the phenomenon of the corner thinning is not observed. Accordingly, the gate oxide layer 180 is not formed in the divot. Particularly, since the pull-back amount C1 of the patterned mask layer 120 in the periphery region 104 is larger than he pull-back amount C2 of the patterned mask layer 120 in the memory region 102, the gate oxide layer 180 subsequently formed on the STI structure 170 in the periphery region 104 may have a larger thickness than prior art. Accordingly, the gate oxide layer can provide an improved insulation property.

Figure 2A:
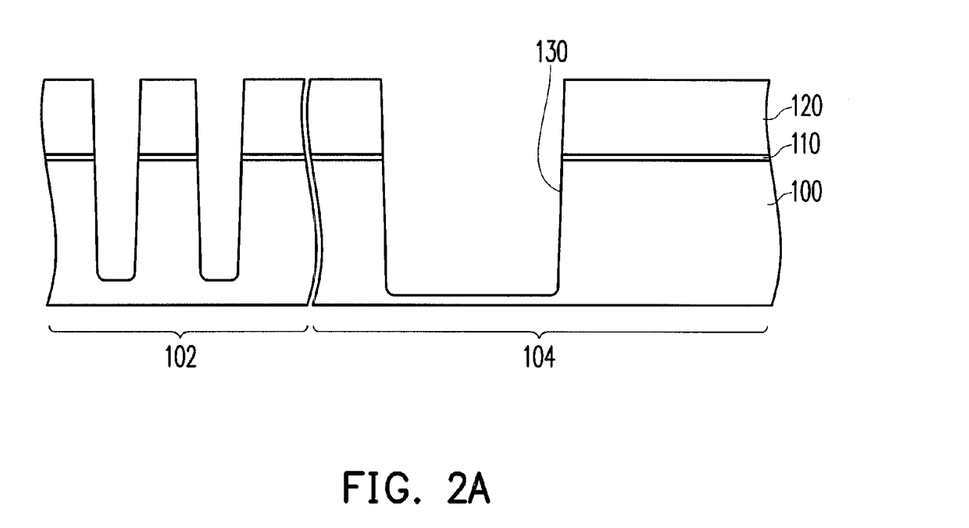
FIGS. 2A to 2E are schematic cross-sectional views illustrating a method for fabricating shallow trench isolation structures according to a second embodiment of the present invention.

FIGS. 2A to 2E are schematic cross-sectional views illustrating a method for fabricating shallow trench isolation structures according to a second embodiment of the present invention. Referring to FIG. 2A, first, a patterned pad layer 110 and a patterned mask layer 120 are sequentially formed on a substrate 100, wherein the substrate 100 includes a memory region 102 and a periphery region 104. Then, by using the patterned mask layer 120 as a mask, a portion of the substrate 100 is removed to form a plurality of trenches 130. The foregoing steps are described in the first embodiment and the description is not repeated herein.

Figure 2B:
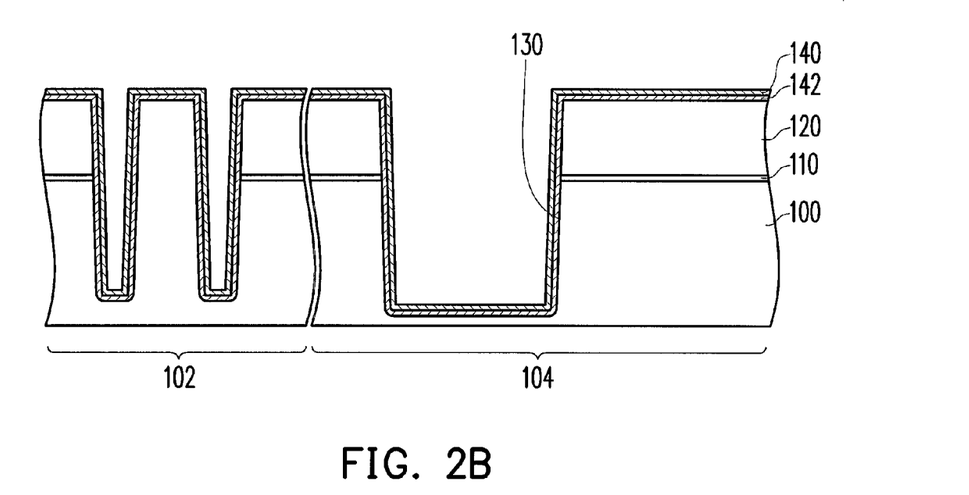

Referring to FIG. 2B, next, a second liner layer 142 is formed on the substrate 100 to cover surfaces of the patterned mask layer 120, the patterned pad layer 110 and the trenches 130. In the present embodiment, the second insulating layer 142 can be a nitride layer, and a material of the second insulating layer 142 can be silicon nitride. A method of forming the second liner layer 142 is a low pressure chemical vapor deposition (LPCVD) process, for example. The thickness of the second liner layer 142 is about 100 Å, for example. Specifically, in an embodiment, a thin oxide layer can be formed on the substrate 100 before the second liner layer 142 is formed, and the thickness of the thin oxide layer is about 10 Å, for example.

Next, a first liner layer 140 is formed on the second liner layer 142. In the present embodiment, the first liner layer 140 is an oxide layer, and the oxide layer includes high temperature oxide (HTO) or oxide formed by using tetra-ethyl-orthosilicate (TEOS) as a source of the reactive gas, for example. The thickness of the first liner layer 140 is about 150 Å, for example. A method of forming the first liner layer 140 can be a low pressure chemical vapor deposition (LPCVD) process. In the present embodiment, after the first liner layer 140 is formed, a densification process is performed on the first liner layer 140. In an embodiment of the present invention, the densification process is performed in a nitrogen-containing or oxygen-containing ambient and at a high temperature, wherein the high temperature is about 900° C. Particularly, in an embodiment of the present invention, by performing the densification process, an etching rate of the first liner layer 140 in an etching solution including hydrofluoric acid and ethylene glycol or hydrofluoric acid and glycerol substantially equals to an etching rate of the silicon nitride as much as possible. It is noted that the second liner layer 142 of nitride and the first liner layer 140 of silicon oxide are sequentially formed on the substrate 100 in the present embodiment, but the invention is not limited thereto. In another embodiment, after the second liner layer 142 of nitride is formed, a portion of the second liner layer 142 is transformed to an oxide layer by performing in situ steam generation (ISSG), and thus the first liner layer 140 of oxide is formed. Alternatively, in an embodiment, a first oxide layer is deposited on the surface of the second liner layer 142 by a LPCVD process, and then by performing ISSG, oxidation gas is penetrated into the first oxide layer to transform a portion of the second liner layer 142 into a second oxide layer. In this method, the first oxide layer and the second oxide layer are combined into the first liner layer 140 of oxide. In other words, the second liner layer 142 and the first liner layer 140 are also formed as illustrated in FIG. 2B.

Figure 2C:
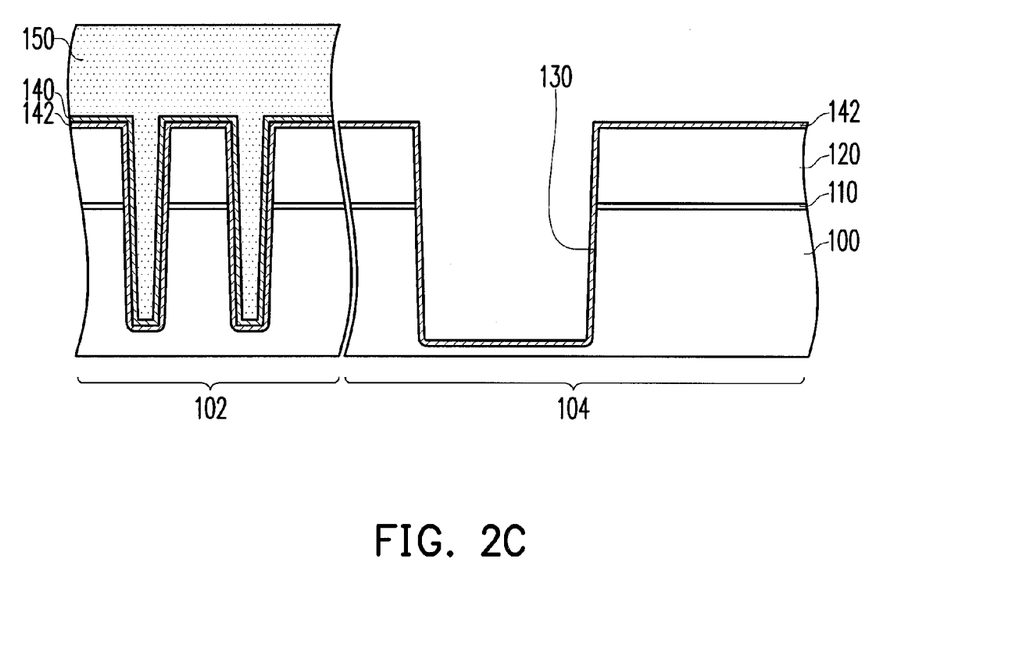

Referring to FIG. 2C, thereafter, the first liner layer 140 covering the surfaces of the patterned mask layer 120, the patterned pad layer 110 and the trenches 130 in the periphery region 104 is removed. In detail, in the present embodiment, a photoresist layer 150 is formed in the memory region 102 to cover the first liner layer 140 in the memory region 102, and then the first liner layer 140 in the periphery region 104 is removed. Accordingly, the first liner layer 140 in the memory region 102, covered by the photoresist layer 150 to be protected, is retained. On contrary, the first liner layer 140 in the periphery region 104, not covered by the photoresist layer 150, is removed and the second liner layer 142 is exposed. A method of removing the first liner layer 140 can be a wet etching process by using BHF as the etching solution, for example.

Figure 2D:
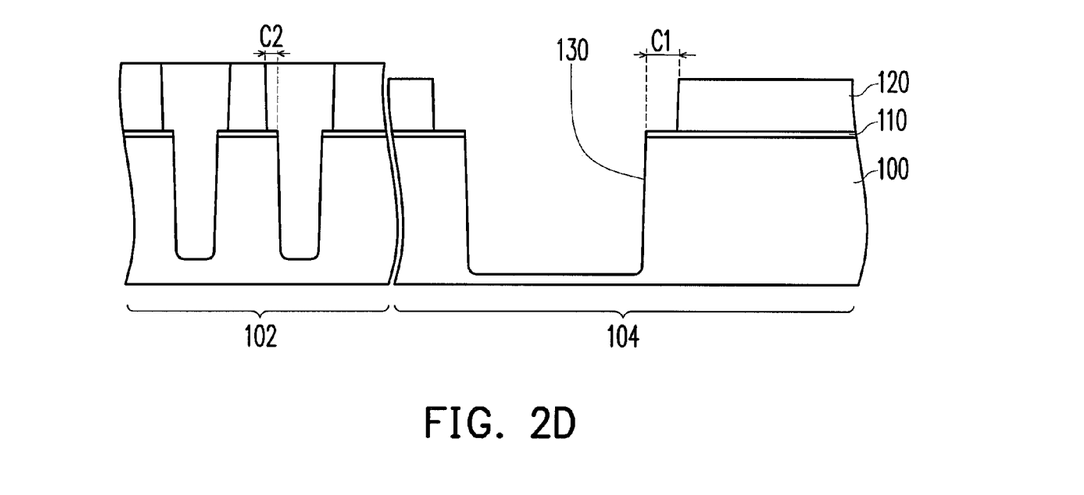

Referring to FIG. 2D, afterwards, the photoresist layer 150 is removed and a cleaning process is performed to remove residues. After the photoresist layer 150 is removed, the memory region 102 is covered by the first liner layer 140 and the second liner layer 142, and the periphery region 104 is covered by the second liner layer 142 only.

Next, a pull-back process is performed on the patterned mask layer 120, wherein a pull-back amount C1 of the patterned mask layer 120 in the periphery region 104 is larger than a pull-back amount C2 of the patterned mask layer 120 in the memory region 102. In an embodiment, the pull-back process can include a wet etching process by using the etching solution including hydrofluoric acid and ethylene glycol or hydrofluoric acid and glycerol. In the present embodiment, compared with the patterned mask layer 120 in the periphery region 104 which is protected by the second liner layer 142 covering thereon, the patterned mask layer 120 in the memory region 102 is protected by the first liner layer 140 and the second liner layer 142 covering thereon. Therefore, the pull-back amount C2 of the patterned mask layer 120 in the memory region 102 is less than the pull-back amount C1 of the patterned mask layer 120 in the periphery region 104. Particularly, the pull-back amount C1, C2 can be adjusted properly by controlling the thickness of the liner layer and the parameters for the pull-back process, such as etching time and so on. Furthermore, the thickness of the patterned mask layer 120 in the periphery region 104 is smaller than the thickness of the patterned mask layer 120 in the memory region 102.

Figure 2E:
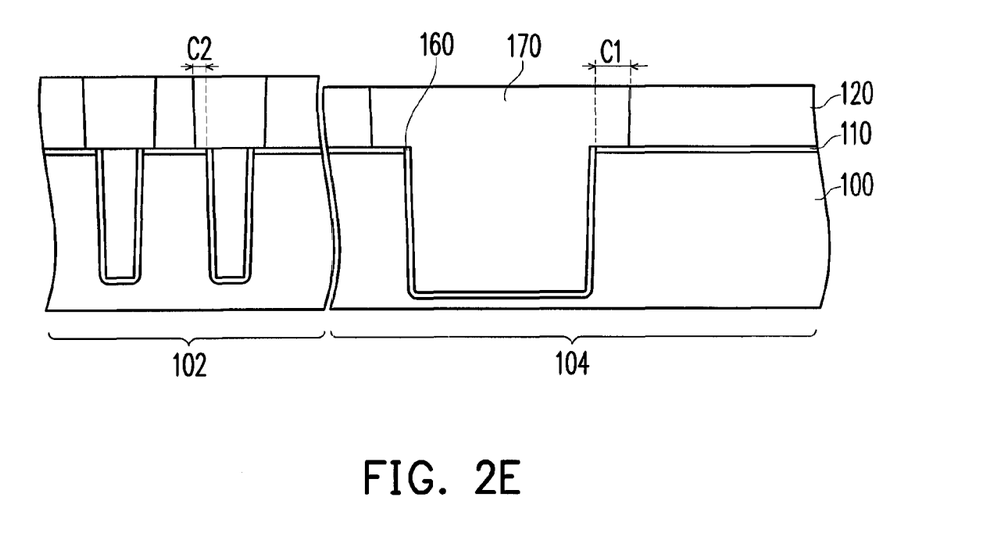

Referring to FIG. 2E, thereafter, an insulating layer 160 is formed in the trenches 130 to form a plurality of shallow trench isolation structures 170. In the present embodiment, the insulating layer 160 is an oxide layer, for example. The method of forming the insulating layer 160 can be referred to the discussion of the above first embodiment, and the concerning explanation is omitted herein.

After the shallow trench isolation structures 170 are formed, the subsequent fabrication processes to accomplish the memory device, such as removal of the patterned mask layer 120 and the patterned pad layer 110, formation of the tunnel oxide layer and the floating gate in the memory region 102, and formation of the gate oxide layer and control gate in the periphery region 104, can be known by the person having ordinary skill in the art, and then not further described here.

The pull-back amount C1 of the patterned mask layer 120 in the periphery region 104 is larger than the pull-back amount C2 of the patterned mask layer 120 in the memory region 102. Accordingly, a space, formed as the patterned mask layer pulled back, is filled with the insulating material, and thus the upper corner of the STI structure 170 is prevented from being damaged by the etching solution used for removing the patterned pad layer 110. Accordingly, the phenomenon of the corner thinning is not observed in the tunnel oxide layer or the gate oxide layer subsequently formed on the STI structure 170, or is not formed in the divot. For example, as shown in FIGS. 4C and 4D, a divot is not observed around the upper corner 170a of the STI structure 170 formed by the method according to the present embodiment. Therefore, the gate oxide layer 180 formed on the upper corner of the STI structure 170 may have an uniform thickness, and the phenomenon of the corner thinning is not observed. Accordingly, the gate oxide layer 180 is not formed in the divot. Particularly, since the pull-back amount C1 of the patterned mask layer 120 in the periphery region 104 is larger than he pull-back amount C2 of the patterned mask layer 120 in the memory region 102, the gate oxide layer 180 subsequently formed on the STI structure 170 in the periphery region 104 may have a larger thickness than prior art. Accordingly, the gate oxide layer can provide an improved insulation property.

It is noted that the second liner layer 142 is directly formed on the substrate 100 in the present embodiment, but the invention is not limited thereto. In other embodiments, an oxide layer can be formed on the substrate 100, and a second liner layer 142 including nitride is then formed on the oxide layer.

Figure 3A:
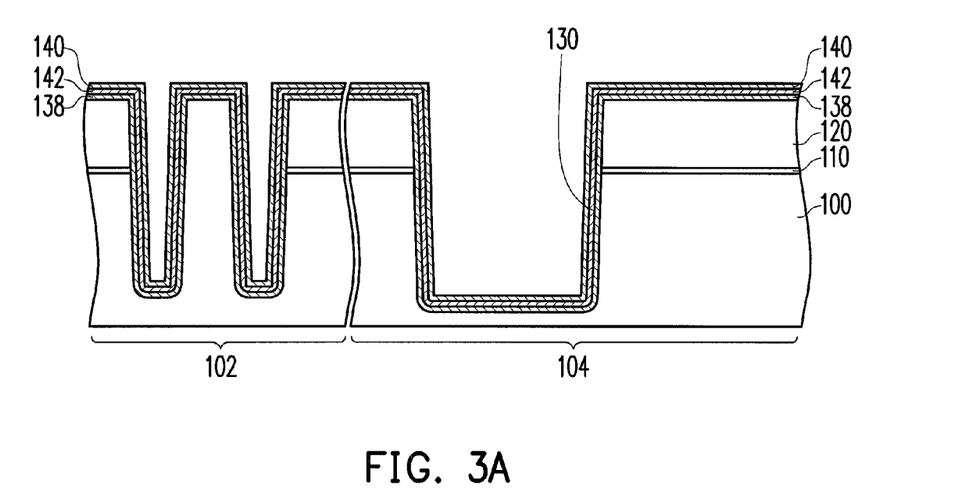
FIGS. 3A to 3D are schematic cross-sectional views illustrating a method for fabricating shallow trench isolation structures according to a third embodiment of the present invention.

FIGS. 3A to 3D are schematic cross-sectional views illustrating a method for fabricating shallow trench isolation structures according to a third embodiment of the present invention. In the embodiment, the method is substantially the same as the method illustrated in FIGS. 2A to 2E, and thus only the major difference is described in following. Referring to FIG. 3A, first, an oxide layer 138 is formed over the substrate 100. A method of forming the oxide layer 138 can be a LPCVD process. Then, in an embodiment of the present invention, by performing a densification process on the oxide layer 138 in a nitrogen ambient and at a high temperature, an etching rate of the oxide layer 138 in an etching solution including hydrofluoric acid and ethylene glycol or hydrofluoric acid and glycerol substantially equals to an etching rate of the silicon nitride as much as possible. Next, a second liner layer 142 and a first liner layer 140 are sequentially formed on the oxide layer 138. In the present embodiment, a method of forming the second liner layer 142 includes forming a silicon nitride layer through a LPCVD process, for example. A method of forming the first liner layer 140 is to transform a portion of the second liner layer 142 to an oxide layer by performing ISSG, and thus the first liner layer 140 including oxide is formed. Accordingly, in the present embodiment, the oxide layer 138, the second liner layer 142 including nitride and the first liner layer 140 including oxide are formed on the substrate 100 sequentially.

Figure 3B:
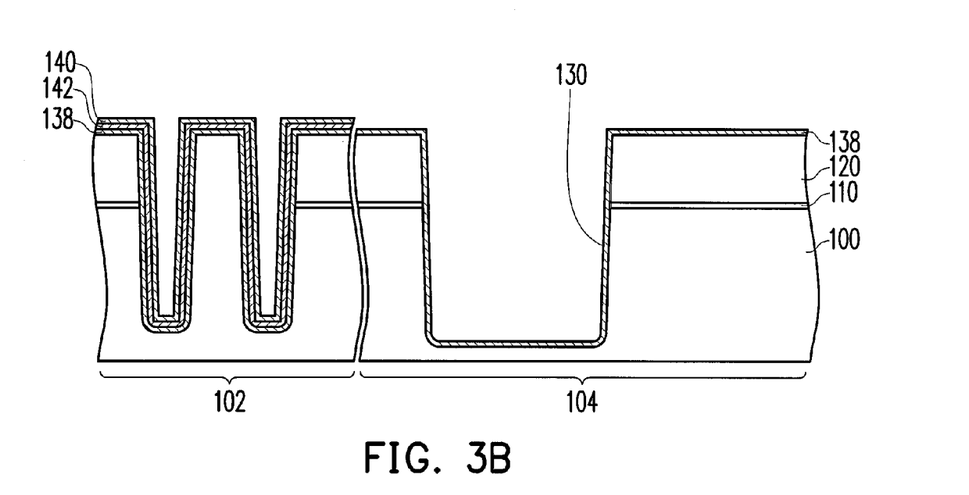

Referring to FIG. 3B, thereafter, the first liner layer 140 and the second liner layer 142 covering the surfaces of the patterned mask layer 120, the patterned pad layer 110 and the trenches 130 in the periphery region 104 are removed. In detail, in the present embodiment, a photoresist layer (not shown) is formed in the memory region 102 to cover the first liner layer 140 in the memory region 102, and then the first liner layer 140 in the periphery region 104 is removed. Next, the photoresist layer is removed and a cleaning process is performed to remove residues. After that, the second liner layer 142 in the periphery region 104 is removed. A method of removing the first liner layer 140 can be a wet etching process by using BHF as the etching solution, for example. A method of removing the second liner layer 142 can be a wet etching process by using hot phosphoric acid as the etching solution. After the first liner layer 140 in the periphery region 104, the photoresist layer in the memory region 102 and the second liner layer 142 in the periphery region 104 are removed, the first liner layer 140 in the memory region 102 and the oxide layer 138 in the periphery region 104 are exposed.

Figure 3C:
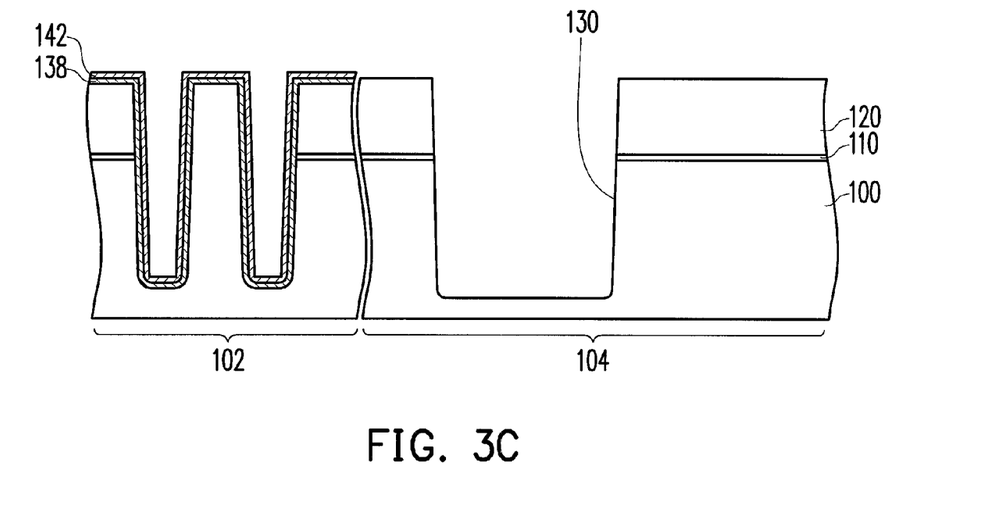

Referring to FIG. 3C, afterwards, the first liner layer 140 in the memory region 102 and the oxide layer 138 in the periphery region 104 are removed. A method of removing the first liner layer 140 and the oxide layer 138 can be a wet etching process by using BHF as the etching solution, for example. It is noted that in another embodiment, the step of removing the first liner layer 140 and the oxide layer 138 can be omitted. Accordingly, the patterned mask layer 120 in the periphery region 104 is protected by the oxide layer 138 formed thereon, and the patterned mask layer 120 in the memory region 102 is protected by the first liner layer 140, the second liner layer 142 and the oxide layer 138 formed thereon.

Figure 3D:
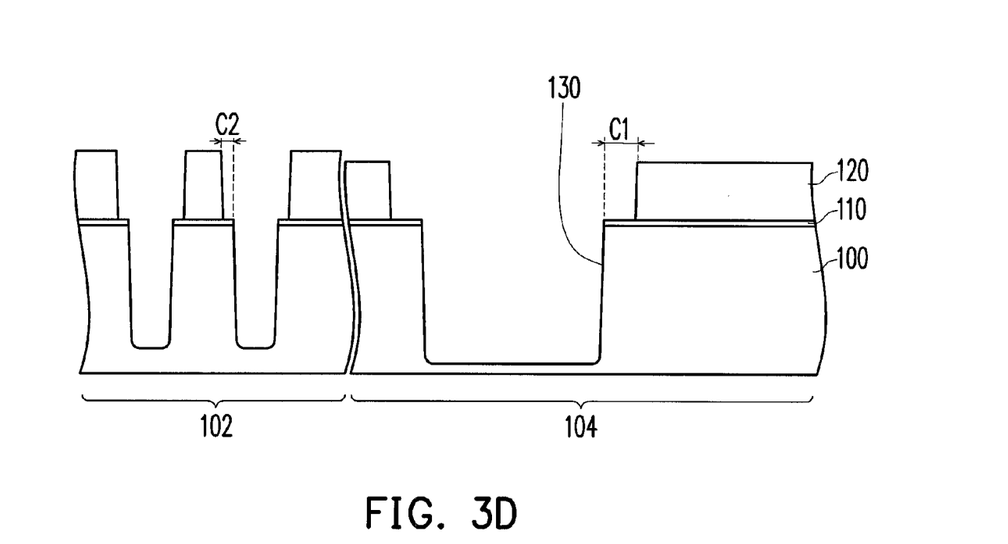

Referring to FIG. 3D, next, a pull-back process is performed on the patterned mask layer 120, wherein a pull-back amount C1 of the patterned mask layer 120 in the periphery region 104 is larger than a pull-back amount C2 of the patterned mask layer 120 in the memory region 102. In an embodiment, the pull-back process can include a wet etching process by using the etching solution including hydrofluoric acid and ethylene glycol or hydrofluoric acid and glycerol. In the present embodiment, compared with the exposure of the patterned mask layer 120 in the periphery region 104, the patterned mask layer 120 in the memory region 102 is protected by the second liner layer 142 and the oxide layer 138 covering thereon. Therefore, the pull-back amount C2 of the patterned mask layer 120 in the memory region 102 is less than the pull-back amount C1 of the patterned mask layer 120 in the periphery region 104. Furthermore, the thickness of the patterned mask layer 120 in the periphery region 104 is smaller than the thickness of the patterned mask layer 120 in the memory region 102. Particularly, the pull-back amount C1, C2 can be adjusted properly by controlling the thickness of the liner layers and the parameters for the pull-back process, such as etching time and so on. After performing the step described above, the subsequent fabrication processes to form a plurality of the STI structures can be referred to the discussion of the above embodiments, and the concerning explanation is omitted herein.

In summary, the present invention is used for forming the STI structures according to the characteristics of the periphery region and the memory region of the memory device, and thus the pull-back amount of the patterned mask layer in the memory region and the pull-back amount of the patterned mask layer in the periphery region are different. Therefore, a divot, caused by the removal of the patterned pad layer or other layers, is not generated around the upper corner of the STI structure, and the tunnel oxide layer or the gate oxide layer subsequently formed on the STI structure may have an uniform thickness on the upper corner and bulk of the STI structure. Accordingly, the phenomenon of the corner thinning is not observed. Hence, the characteristics and the reliability of the memory device are improved.

Although the invention has been described with reference to the above embodiments, it will be apparent to one of the ordinary skill in the art that modifications to the described embodiment may be made without departing from the spirit of the invention. Accordingly, the scope of the invention will be defined by the attached claims not by the above detailed descriptions.

What is claimed is:

1. A method for fabricating shallow trench isolation structures, the method comprising:

forming a patterned pad layer and a patterned mask layer sequentially on a substrate, wherein the substrate includes a memory region and a periphery region;

removing a portion of the substrate by using the patterned mask layer as a mask to form a plurality of trenches;

forming a first liner layer on the substrate to cover surfaces of the patterned mask layer, the patterned pad layer and the trenches;

removing the first liner layer covering the surfaces of the patterned mask layer, the patterned pad layer and the trenches in the periphery region;

performing a pull-back process on the patterned mask layer, wherein a pull-back amount of the patterned mask layer in the periphery region is larger than a pull-back amount of the patterned mask layer in the memory region; and forming an insulating layer in the trenches to form a plurality of shallow trench isolation structures.

2. The method for fabricating shallow trench isolation structures as claimed in claim 1, wherein the first liner layer comprises an oxide layer.

3. The method for fabricating shallow trench isolation structures as claimed in claim 2, wherein a material of the first liner layer comprises high temperature oxide (HTO) or oxide formed by using tetra-ethyl-ortho-silicate (TEOS) as a source of the reactive gas.

4. The method for fabricating shallow trench isolation structures as claimed in claim 1, further comprising performing a densification process on the first liner layer in a nitrogen ambient and at a high temperature.

5. The method for fabricating shallow trench isolation structures as claimed in claim 1, wherein the step of removing the first liner layer covering the surfaces of the patterned mask layer, the patterned pad layer and the trenches in the periphery region comprises:

forming a photoresist layer in the memory region to cover the first liner layer in the memory region; and removing the first liner layer in the periphery region.

6. The method for fabricating shallow trench isolation structures as claimed in claim 5, wherein a method of removing the first liner layer comprises a wet etching process.

7. The method for fabricating shallow trench isolation structures as claimed in claim 1, wherein the pull-back process comprises a wet etching process.

8. The method for fabricating shallow trench isolation structures as claimed in claim 1, before forming the first liner layer, the method further comprising forming a second liner layer to cover surfaces of the patterned mask layer, the patterned pad layer and the trenches.

9. The method for fabricating shallow trench isolation structures as claimed in claim 8, wherein a material of the second liner layer comprises silicon nitrides.

10. The method for fabricating shallow trench isolation structures as claimed in claim 8, further comprising performing a densification process on the first liner layer in a nitrogen-containing or a oxygen-containing ambient and at a high temperature.

11. The method for fabricating shallow trench isolation structures as claimed in claim 8, wherein in the pull-back process, the patterned mask layer in the memory region is covered sequentially by the second and first liner layers, and the patterned mask layer in the periphery region is covered by the second liner layer.

* * * * *